US009772012B2

(12) United States Patent
Takanami (10) Patent No.: US 9,772,012 B2
(45) Date of Patent: Sep. 26, 2017

(54) DRIVE MECHANISM AND MANUFACTURING DEVICE

(71) Applicant: KAIJO CORPORATION, Tokyo (JP)

(72) Inventor: Shuichi Takanami, Tokyo (JP)

(73) Assignee: KAIJO CORPORATION, Tokyo (JP)

( * ) Notice: Subject to any disclaimer, the term of this patent is extended or adjusted under 35 U.S.C. 154(b) by 0 days.

(21) Appl. No.: 14/903,800

(22) PCT Filed: May 30, 2014

(86) PCT No.: PCT/JP2014/064402
§ 371 (c)(1),
(2) Date: Jan. 8, 2016

(87) PCT Pub. No.: WO2015/029527
PCT Pub. Date: Mar. 5, 2015

(65) Prior Publication Data
US 2016/0169355 A1    Jun. 16, 2016

(30) Foreign Application Priority Data

Sep. 2, 2013  (JP) ................................. 2013-181199

(51) Int. Cl.
*B25J 9/00* (2006.01)
*F16H 21/46* (2006.01)
*H01L 23/00* (2006.01)

(52) U.S. Cl.
CPC ............ *F16H 21/46* (2013.01); *B25J 9/0033* (2013.01); *H01L 24/742* (2013.01); *H01L 24/78* (2013.01);
(Continued)

(58) Field of Classification Search
CPC .............................. B25J 9/0033; F16H 21/46; H01L 2224/1134; H01L 2224/78353;
(Continued)

(56) References Cited

U.S. PATENT DOCUMENTS

2004/0245314 A1* 12/2004 Vischer ................ B23K 20/005
228/4.5
2011/0208356 A1    8/2011 Kato et al.
2014/0020507 A1    1/2014 Sasaki et al.

FOREIGN PATENT DOCUMENTS

EP      1 637 277    3/2006
JP      61-197135    9/1986
(Continued)

OTHER PUBLICATIONS

International Search Report issued Sep. 2, 2014 in International Application No. PCT/JP2014/064402.

*Primary Examiner* — George Koch
(74) *Attorney, Agent, or Firm* — Wenderoth, Lind & Ponack, L.L.P.

(57) ABSTRACT

A driving mechanism including a first rod (103a), a second rod (104a), a first planar motor (106) moving on a plane, a center planar motor (105) moving on the plane and a moving portion (101), in which one end of the first rod is rotatably connected to the moving portion by a first rotation fulcrum (125a), the other end of the first rod is rotatably connected to the first planar motor by a second rotation fulcrum (126a), one end of the second rod is rotatably connected by a third rotation fulcrum (128a) provided on the first rod. The other end of the second rod is rotatably connected to the center planar motor by a fourth rotation fulcrum (127a), and the moving portion is moved so as to recede from the center planar motor when the first planar motor is moved near to the center planar motor.

9 Claims, 10 Drawing Sheets

(52) U.S. Cl.
CPC . *H01L 2224/1134* (2013.01); *H01L 2224/786* (2013.01); *H01L 2224/78353* (2013.01); *H01L 2224/78821* (2013.01); *H01L 2924/00014* (2013.01)

(58) Field of Classification Search
CPC ..... H01L 2224/786; H01L 2224/78821; H01L 24/742; H01L 24/78
USPC .......................................................... 156/64
See application file for complete search history.

(56) References Cited

FOREIGN PATENT DOCUMENTS

| | | |
|---|---|---|
| JP | 63-138406 | 6/1988 |
| JP | 1-24840 | 7/1989 |
| JP | 8-211173 | 8/1996 |
| JP | 9-268782 | 10/1997 |
| JP | 2008-98409 | 4/2008 |
| JP | 2011-167817 | 9/2011 |
| JP | 2012-114359 | 6/2012 |
| JP | 2012-165604 | 8/2012 |
| WO | 2012/131955 | 10/2012 |

* cited by examiner

DRIVE MECHANISM AND MANUFACTURING DEVICE

This application is a 371 of PCT/JP2014/064402, filed on May 30, 2014.

TECHNICAL FIELD

The present invention relates to a driving mechanism and a manufacturing device provided with that. In this Description, the manufacturing device has a meaning including a manufacturing device for directly manufacturing a product and various devices used in processes for manufacturing the product, and the device includes a wire bonding device, for example.

BACKGROUND ART

Figure 10:
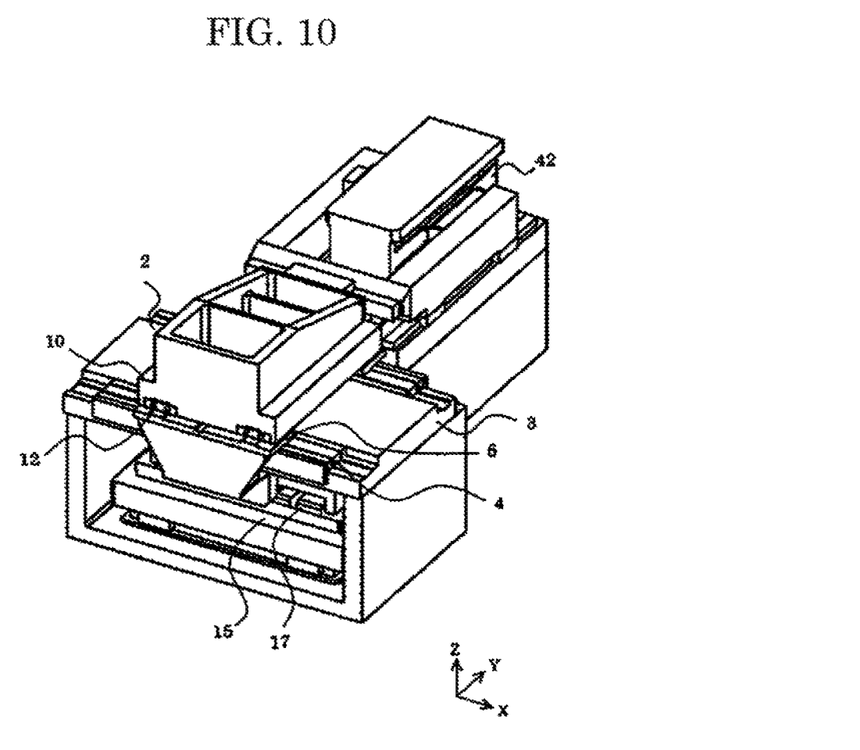
FIG. 10 is a perspective view illustrating a prior-art wire bonding device.

FIG. 10 is a perspective view illustrating a prior-art wire bonding device.

In this wire bonding device, XYZ axes form a three-layer structure On a first layer 2, a fixed base 3 is arranged, and an X-axis cross roller guide 4 is provided on the fixed base 3. On a X-axis motor portion 15, an X-linear motor 17 is arranged. By means of the X-linear motor 17, a lower moving plate 6 is moved in an X-axis direction on the X-axis cross roller guide 4. On a second layer, a Y-axis cross roller guide 12 is arranged, and by means of a Y-linear motor 42, an upper moving body 10 is moved in a Y-axis direction on the Y-axis cross roller guide 12.

On a third layer, a Z-rotation fulcrum placed on the upper moving body 10 is provided, and at this Z-rotation fulcrum, an ultrasonic horn and a capillary are arranged so that the Z rotation fulcrum is swung/driven by a Z-motor (not shown). That is, it is so constituted that by means of a driving force of the Z-motor, the capillary and the ultrasonic horn can be moved in a Z-axis direction Moreover this device has a bonding mechanism (not shown) for performing bonding by supplying a wire to the capillary.

The aforementioned bonding mechanism is a mechanism in which the wire is supplied to the capillary, a ball is formed at a tip end of the wire fed out of the capillary, the ball is moved by the capillary to a 1st bonding point, and at that time, by applying a pressure to the ball from the capillary while applying the ultrasonic vibration to the ball by the ultrasonic horn, the wirebonded to the 1st bonding point and then, the capillary is moved to a 2nd bonding point and at that time, by applying the pressure from the capillary while applying the ultrasonic vibration to the by the ultrasonic horn, the wire is bonded to the 2nd bonding point.

In the aforementioned wire bonding device, by moving the lower moving plate 6 in the X-axis direction by the X-linear motor 17 of the first layer 2, the upper moving body 10 placed on that, and the ultrasonic horn and the capillary at the Z-rotation fulcrum are also moved in the X-axis direction. Moreover by moving the upper moving body 10 in the Y-axis direction by the Y-linear motor 42 of the second layer, the ultrasonic horn and the capillary placed on that at the rotation fulcrum are also moved in the Y-axis direction. However even by moving the upper moving body 10 in the Y-axis direction, the lower moving plate 6 is not moved. Moreover, the capillary and the ultrasonic horn at the Z-rotation fulcrum are swung by the Z-motor of the third layer However, even if the Z-rotation fulcrum is swung, the lower moving plate 6 and the upper moving body 10 are not moved except a swing Y-component of the Z-axis. As the result of synthetic driving from the first layer to the third layer, precise XYZ movement is realized.

Since the Z-motor of the third layer is exclusively for swing of the Z-rotation fulcrum, it cannot contribute to driving of the X-linear motor 17 of the first layer in the X-axis direction at all but becomes a genuine Similarly, since the Y-linear motor 42 of the second layer is exclusively for movement of the upper moving body 10 in the Y-axis direction, it becomes a load on driving of the X-linear motor 17 of the first layer in the X-axis direction. Moreover, since the Y-axis cross roller guide 12 is arranged on the X-axis cross roller guide 4 and Z-motor is mounted in a box-shaped housing, a, certain degree of size is needed and they also become loads. Therefore, the X-linear motor 17 has a relatively larger load than the Z-motor and is disadvantageous in high acceleration/deceleration.

When the ultrasonic horn and the capillary at the Z-rotation fulcrum are accelerated/rotated, a reaction force is generated fixed portion of the Z-motor, and its vector has an angle close to a right angle with respect to each of the X-axis and the Y-axis and thus, the generated reaction, for becomes a vibration source.

DESCRIPTION OF A RELATED ART

Patent Literature

[Patent Literature 1] Japanese Paten Laid-Open No. 2012-114359

SUMMARY OF THE INVENTION

Problem to be Solved by the Invention

An aspect of the present invention has an object provide a driving mechanism or a manufacturing device with a smaller load which is advantageous for high acceleration/deceleration.

Means to Solve the Problem

Various aspects of the present invention will be described below.

[1] A driving mechanism including a first rod, a second rod, a first moving mechanism moving on a plane, a center moving mechanism moving on the plane, and a moving portion, in which one end of the first rod is rotatably connected to the moving portion by a first rotation fulcrum; the other end of the first rod is rotatably connected to the first moving mechanism by a second rotation fulcrum; one end of the second rod is rotatably connected by a third rotation fulcrum provided on the first rod; the other end of the second rod is rotatably connected to the center moving mechanism by a fourth rotation fulcrum; the moving portion is moved so as to recede from the center moving mechanism when the first moving mechanism is moved near to the center moving mechanism; and the moving portion is moved so as to approach the center moving mechanism when the first moving mechanism is moved away from the center moving mechanism.

[2] The driving mechanism according to the above [1], further comprising a third rod, a fourth rod and a second moving mechanism moving on the plane, wherein: one end of the third rod is rotatably connected to the moving portion by a fifth rotation fulcrum; the other end of the third rod is rotatably connected to the second moving mechanism by a sixth rotation fulcrum; one end of the fourth rod is rotatably connected by a seventh rotation fulcrum provided on the third rod; the other end of the fourth rod is rotatably connected to the center moving mechanism by an eighth rotation fulcrum; the moving portion is moved so as to recede from the center moving mechanism when the second moving mechanism is moved near to the center moving mechanism; and the moving portion is moved so as to approach the center moving mechanism when the second moving mechanism is moved away from the center moving mechanism.

[2'] In [2], the driving mechanism in which the second moving mechanism is a second planar motor or a second XY table.

[3] The driving mechanism according to any one of the above [1], [2] and [2'] further comprising: a first linear guide which guides the center moving mechanism so as to move on a first straight line on the plane; and a third moving mechanism which moves the first linear guide along a second straight line on the plane crossing the first straight line.

[4] The driving mechanism according to the above [3], wherein the third moving mechanism includes: a fixed linear guide which guides both ends of the first linear guide so as to move on the second straight line; and a linear motor which moves the first linear guide on the second straight line.

[5] The driving mechanism according to the above [3] or [4], further comprising a second linear guide which guides the first moving mechanism so as to move on a third straight line on the plane connecting the center moving mechanism and the first moving mechanism, wherein the second linear guide is guided by the first linear guide so as to move along the first straight line.

[6] The driving mechanism according to any one of the above [1] to [4] and [2'], further comprising: an angular encoder which detects an angle of the first rod or the second rod; and a control portion which controls the first planar motor so as to correct a positional shift of the first moving mechanism on the basis of the angle detected by the angular encoder.

[7] The driving mechanism according to any one of the above [1] to [6] and [2'], further comprising: a stress detection sensor which detects strain of the first rod or the second rod; and a control portion which controls the first moving mechanism so as to correct a positional shift of the first moving mechanism on the basis of the strain detected by the stress detection sensor.

[8] The driving mechanism according to any one of the above [1] to [7] and [2'], wherein the first moving mechanism is a first planar motor or a first XY table; and the center moving mechanism is a center planar motor or a center XY table.

[9] A manufacturing device comprising a driving mechanism according to any one of the above [1] to [8].

[10] The manufacturing device according to the above [9], further comprising: a capillary arranged on the moving portion; and a bonding mechanism which supplies a wire to the capillary and performs wire bonding.

Effect of the Invention

According to an aspect of the present invention, a driving mechanism or a manufacturing device with a smaller load and advantageous for high acceleration/deceleration can be provided.

DESCRIPTION OF THE PREFERRED EMBODIMENTS

Hereinafter, embodiments and Examples of the present invention Will be explained in detail using the drawings. However, a person skilled in the art would be able to easily understand that the present invention is not limited to the following explanations but forms and details thereof may be variously modified without deviating from the purport and the scope of the present invention. Accordingly, the present invention is not to be construed as being limited to the description of the embodiments and Examples, shown (First Embodiment)

Figure 1:
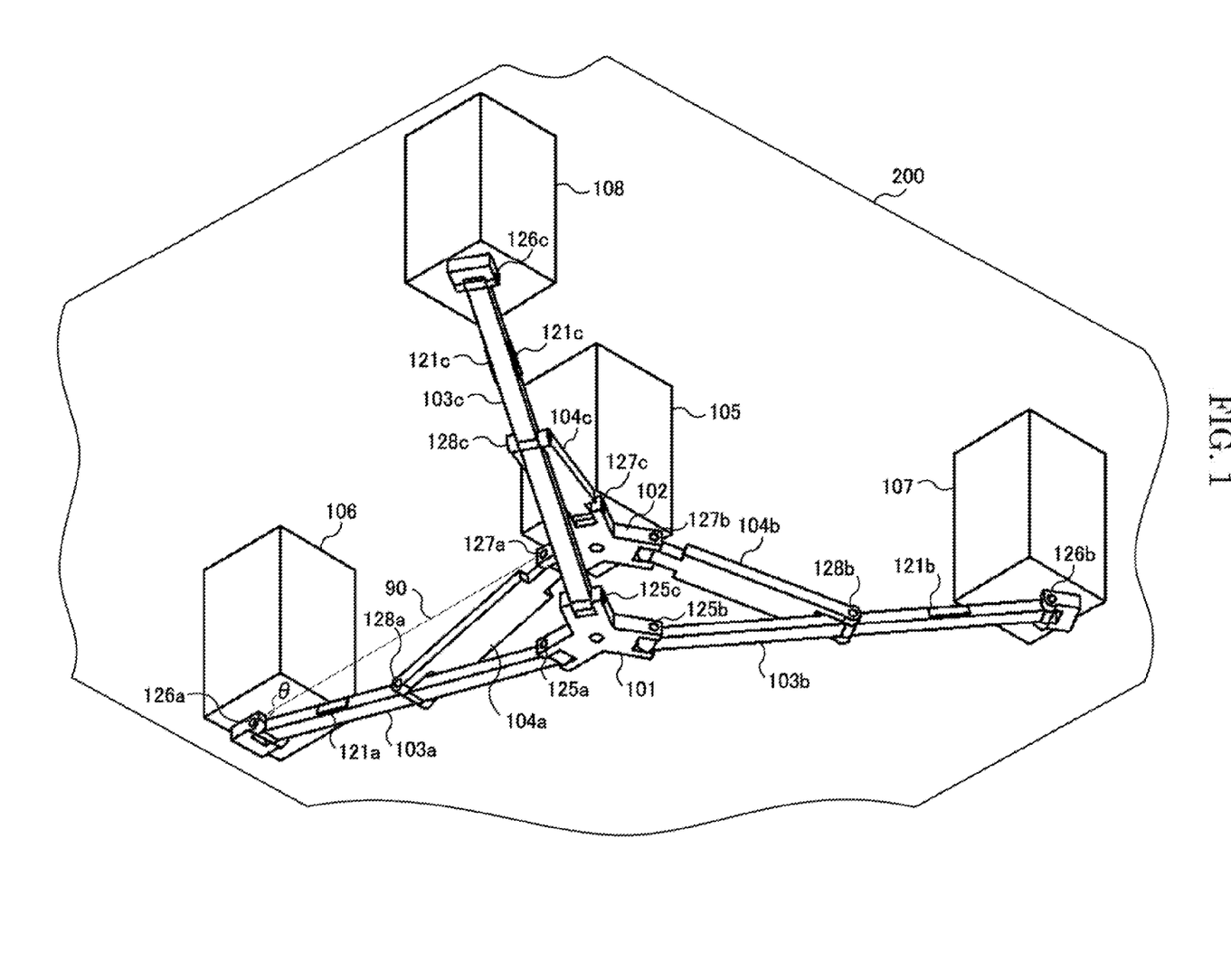
FIG. 1 is a schematic view illustrating a driving mechanism according to an aspect of the present invention.
Figure 2:
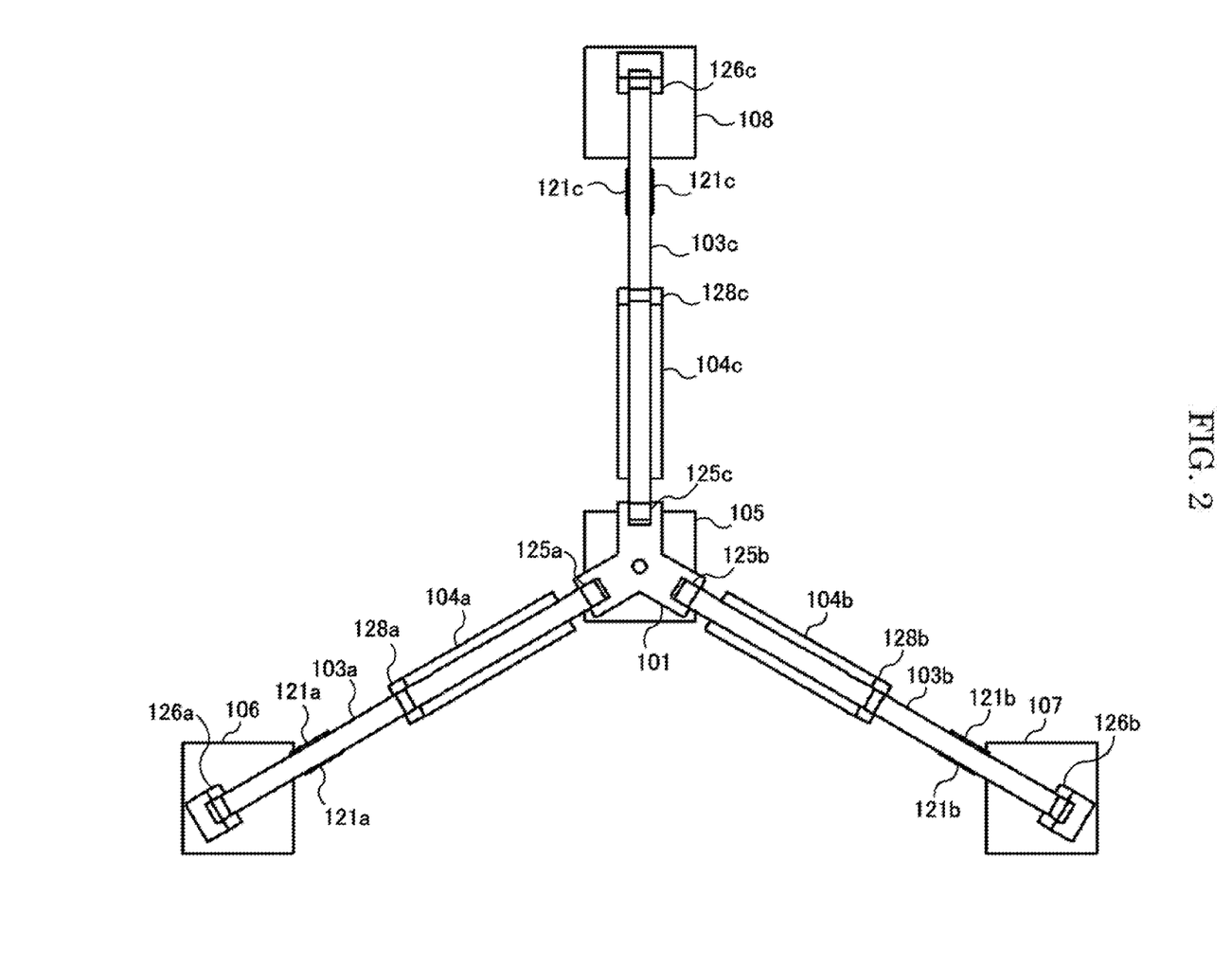
FIG. 2 is a plan view of the driving mechanism illustrated in FIG. 1.

FIG. 1 is a schematic view illustrating a driving mechanism according to an aspect of the present invention. FIG. 2 is a plan view of the driving mechanism illustrated in FIG. 1.

The driving mechanism can move a moving portion 101 in a space of XYZ axes by combining four planar motors and three Scott-Russell link mechanisms. For the four planar motors, no planar motors may be used.

Detailed description will be given below.

The driving mechanism illustrated in FIGS. 1 and 2 has a first planar motor (hereinafter also referred to as an "8-o'clock motor") 106, a second planar motor (hereinafter also referred to as a "4-o'clock motor") 107, a third planar motor (hereinafter also referred to as a "12-o'clock motor" 108, and a center planar motor 105, and these planar motors are constituted to move on the same plane (on an XY plane 200).

The driving mechanism has a first rod 103a, a second rod 104a, a third rod 103b, a fourth rod 104b, a fifth rod 103c, a sixth rod 104c, a moving portion 101, and a fixed portion 102. On the fixed portion 102, the center planar motor 105 is mounted.

One end of the first rod 103a is rotatably connected to the acing, portion 101 by a first rotation fulcrum 125 and the other end of the first rod 103a is rotatably connected to the 8-o'clock motor 106 by a s second rotation fulcrum 126a. One end of the second rod 104a is rotatably connected to a center of the first rod 103a by a third rotation fulcrum 128a, and the other end of the second rod 104a is rotatably connected to the fixed portion 102 by a fourth rotation fulcrum 127a. The moving portion 101, the fixed portion 102, the first and second rods 103a and 104a, the 8-o'clock motor 106, and the first to fourth rotation fulcrums 125a, 126a, 128a, and 127a constitute a first Scott-Russell link mechanism.

One end of the third rod 103b is rotatably connected to the moving portion 101 by a fifth rotation fulcrum 125b, and the other end of the third rod 103b is rotatably connected to the 4-o'clock motor 107 by a sixth rotation fulcrum 126b. One end of the fourth rod 104b is rotatably connected to a center of the third rod 103b by a seventh rotation fulcrum 128b, and the other end of the fourth rod 104b is rotatably connected to the fixed portion 102 by an eighth rotation fulcrum 127b. The moving portion 101, the fixed portion 102 the third and fourth rods 103b and 104b, the 4-o'clock motor 107 and the fifth to eighth rotation fulcrums 125b, 126b, 128b, and 127b constitute a second Scott-Russell link mechanism.

One end of the fifth rod 103c is rotatably connected to the moving portion 101 by a ninth rotation fulcrum 125c and the other end of the fifth rod 103c is rotatably connected to the 12-o'clock motor 108 by a tenth rotation fulcrum 126c. One end of the sixth rod 104c is rotatably connected to a center of the fifth rod 103c by an eleventh rotation fulcrum 128c, and the other end of the sixth rod 104c is rotatably connected to the fixed portion 102 by a twelfth rotation fulcrum 127c. The moving portion 101, the fixed portion 102, the fifth and sixth rods 103c and 104c, the 12-o'clock motor 108, and the ninth to twelfth rotation fulcrums 125c, 126c, 128c, and 127c constitute a third Scott-Russell link mechanism.

Movement of the moving portion 101 in the XY direction will be described.

If all of the center planar motor 105, the 8-o'clock motor 106, the 4-o'clock motor 107, and the 12-o'clock motor 108 are moved in the XY direction similarly without changing the relative positions thereof, the moving portion 101 is moved in the XY direction and is not moved in the Z-direction. At this time, distances between the center planar motor 105 and the respective first to third planar motors 106 to 108 are not changed. That is, it is constituted such that all the planar motors are moved in the XY direction similarly while the 8-o'clock position of the first planar motor 106, the 4-o'clock position of the second planar motor 107, and the 12-o'clock position of the third planar motor 108 are maintained with the center planar motor 105 as the center.

Movement of the moving portion 101 in the Z-axis direction will be described.

The first Scott-Russel link mechanism is constituted such that the moving portion 101 is moved so as to recede from the center planar motor 105 when the 8-o'clock motor 106 is moved near to the center planar motor 105, while the moving portion 101 is moved so as to approach the center planar motor 105 when the 8-o'clock motor 106 is moved away from the center planar motor 105. As a result, the moving portion 101 can be moved in the Z-axis direction. If such driving is performed in a state in which the position of the center planar motor 105 is fixed, the moving portion 101 can be moved only in the Z-axis direction without moving to the XY direction, and if such driving is performed while the center planar motor 105 and the 8-o'clock motor 106 are moved in the XY direction while changing the distance, the moving portion 101 can be freely moved in an XYZ space.

Moreover, the second and third Scott-Russell link mechanisms perform driving synchronously with the first Scott-Russell link mechanism. That is, by moving the center planar motor 105, the 8-o'clock motor 106, the 4-o'clock motor 107, and the 12-o'clock motor 108 in the XY-axes directions while changing the distance, the moving portion 101 can be freely moved in the XYZ space.

A specific moving amount of the moving portion 101 in the Z-axis direction will be described.

In the first Scott-Russell link mechanism, assuming that a length of the first rod 103a (a distance between the first rotation fulcrum 125a and the second rotation fulcrum 126a) is L and an angle formed by a straight line 90 connecting the second rotation fulcrum 126a on the other end of the first rod 103a and the fourth rotation fulcrum 127a on the other end of the second rod 104a and a longitudinal direction of the first rod 103a (a straight line connecting the first rotation fulcrum 125a and the second rotation fulcrum 126a) is θ, when the center planar motor 105 is at a fixed position, and the angle θ is changed from α to β by bringing the 8-o'clock motor 106 close to the center planar motor 105 or by separating it away, an input of a moving amount Yz of the 8-o'clock motor 106 is converted as follows and output as a moving amount Z1 of the moving portion 101 in the Z-axis direction:

$$Yz = L(\cos \beta - \cos \alpha) => \text{conversion} => Z1 = L(\sin \beta - \sin \alpha).$$

However, in order to move the moving portion 101 by the driving mechanism as above, each of the second and third Scott-Russell link mechanisms needs to be driven synchronously with the first Scott-Russel link mechanism.

If an angle α is smaller than 45°, since the moving amount Z1 of the moving portion 101 becomes larger than the moving amount Yz of the 8-o'clock motor 106, it is a desirable operation for the bonding device. As an example, the moving amount Z1 becomes 4.51 times the moving amount Yz when α=10° and β=15°.

The driving mechanism has a control portion (not shown), and driving described above of each of the 8-o'clock motor 106, the 4-o'clock motor 107, the 12-o'clock motor 108, and the center planar motor 105 is controlled by this control portion.

Figure 9:
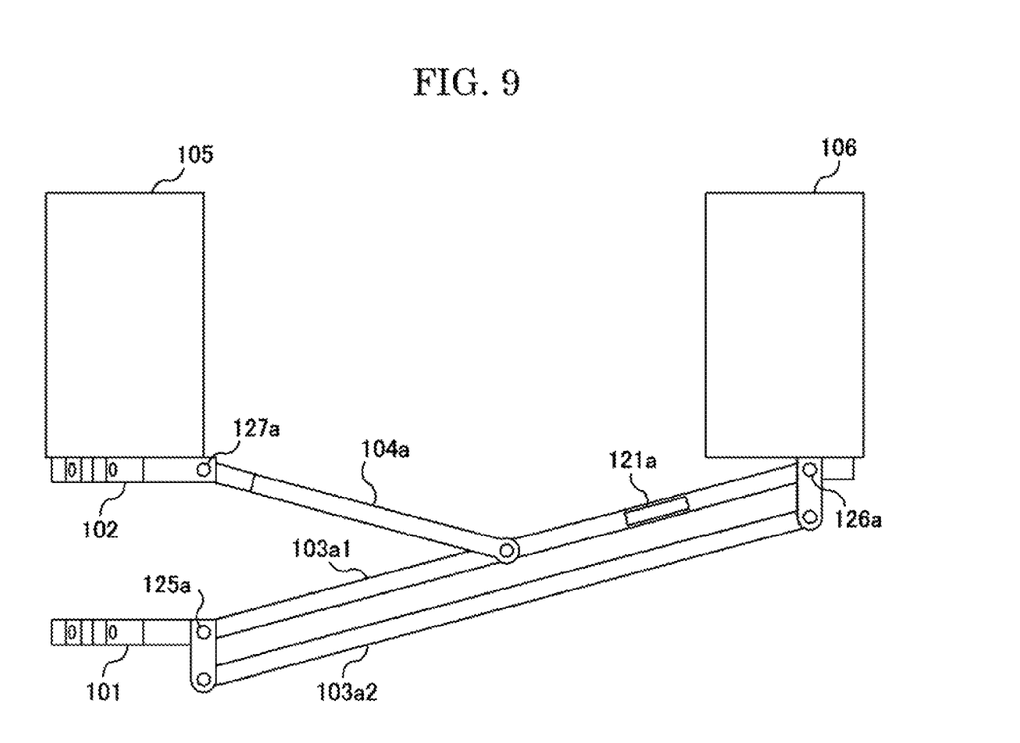
FIG. 9 is a schematic view illustrating the driving mechanism according to a variation of a first embodiment.

In this embodiment, the driving mechanism is put into practice by using three Scott-Russell link mechanisms, but the driving mechanism can be put into practice if at least one Scott-Russell link mechanism is provided. Here as the one Scott-Russell link mechanism, assuming a driving mechanism using only the first Scott-Russell link mechanism, for example, since the rotation fulcrum 125a is freely rotated, the moving portion 101 cannot hold parallel with respect to the fixed portion 102. In order to hold parallel, as illustrated in FIG. 9, it is only necessary that first rods 103a1 and 103a2 are made parallel links, and the other constitution is made similar to this embodiment. In the case of the driving mechanism in which two or more Scott-Russell link mechanisms are arranged at different angles (including 180 degrees at the positions of 12 o'clock and 6 o'clock), the parallel link is not needed.

According to this embodiment, the driving mechanism for freely moving the moving portion 101 in the XYZ space can be produced by combining the planar motor and the Scott-Russell link mechanism. Thus, a driving mechanism with a smaller load and advantageous for high acceleration/deceleration can be realized.

Moreover, in the driving mechanism according to this embodiment, the Z-motor which is a load on the X-linear motor 17 illustrated in FIG. 10 is no longer necessary, a load balance is made appropriate, and higher acceleration/deceleration is made possible. Moreover, in the driving mechanism according to this embodiment, since the X-axis cross roller guide 4 and the Y-axis cross roller guide 12 illustrated in FIG. 10 are not needed, an XY load mass can be made smaller, and high acceleration/deceleration is made possible.

Moreover, in this embodiment, the first planar motor 106, the second planar motor 107, and the third planar motor 108, while keeping the positions at 8 o'clock, at 4 o'clock, and at 12 o'clock, respectively, with the center planar motor 105 as the center, are moved in the XY direction, and thus the moving portion 101 is moved not only in the XY direction but also moved in the Z-axis direction. When the moving portion 101 is accelerated in the Z-axis direction so as to generate a thrust, a reaction force (reaction movement) in a direction opposite to the movement of each of the first to third planar motors 106, 107, and 108 is applied to the fixed portion 102 of the center planar motor 105 and the vector of the reaction force becomes substantially parallel with an XY plane 200. However, since the first to third planar motors are arranged at the positions of 8 o'clock 4 o'clock, and 12 o'clock with the center planar motor 105 as the center with a good balance, the reaction forces applied to the center planar motor cancel each other, the total sum of the vectors of the reaction forces become small, and generation of vibration caused by the reaction force can be suppressed.

By considering the first Scott-Russell link mechanism, for example, if the moving portion 101 is to be moved in the Z-direction, when the 8-o'clock motor 106 is moved near to the center planar motor 105 by the thrust of the 8-o'clock motor 106, a reaction force is applied to the center planar motor 105 in the same direction as the thrust of the 8-o'clock motor 106. In order for the center planar motor 105 not to move but to stay by the reaction force, a slightly smaller thrust in a direction opposite to that of the thrust of the 8-o'clock motor 106 as a drag force against the reaction force applied to the center planar motor 105 may be generated in the center planar motor 105. At the same time, the 8-o'clock motor 106 is subjected to a reaction force in the same direction as the thrust (drag force) of the center planar motor 105. The directions of these two reaction forces are parallel with the XY plane 200 and opposite to each other in direction, but vibration generated by that is equal to a product of the mass and acceleration of a movable portion (8-o'clock motor), and there is no particular merit.

In order to cancel the reaction forces above with each other, with the driving mechanism using two Scott-Russell link mechanisms, for example, it is preferable that the first planar motor is arranged at the position of 6 o'clock and the second planar motor at the position of 12 o'clock with the center planar motor as the center. In the case of the driving mechanism using four Scott-Russell link mechanisms, it is preferable that the first planar motor is arranged at the position of 3 o'clock, the second planar motor at the position of 6 o'clock, the third planar motor at the position of 9 o'clock, and the fourth planar motor at the position of 12 o'clock with the center planar motor as the center. In the case of the driving mechanism using five or more Scott-Russell link mechanisms, too, it is preferable that they are arranged with a good balance.

If the three Scott-Russell link mechanisms are arranged with a good balance and the moving portion 101 is to be moved in the Z-direction as in this embodiment, the thrusts of the respective 8-o'clock motor 106, 4-o'clock motor 107, and 12-o'clock motor 108 cancel each other (the total sum of the vectors becomes zero), and there is a merit that the center planar motor 105 does not have to generate a thrust as a drag force. Moreover, the reaction forces corresponding to the respective thrusts of the 8-o'clock motor 106, 4-o'clock motor 107, and 12-o'clock motor 108 are applied to the fixed portion 102, but since the total sum of the vectors of the reaction forces becomes zero, vibration generated thereby is suppressed.

Moreover, in this embodiment, since the thrust of the moving portion 101 in the Z-axis direction can be divided into three by the first to third planar motors, a load per planar motor becomes small, and higher acceleration/deceleration can be made possible. If four planar motors are used, the thrust can be divided into four, whereby a load per planar motor can be made further smaller.

Moreover, since this embodiment has a structure in which an anti-node of primary resonance of each of the long rods 103a, 103b, and 103c is restricted by the short rods 104a, 104b, and 104c, a resonance frequency can rise easily.

In this embodiment, the driving mechanism which moves the moving portion 101 in the space of the XYZ-axes by combining the four planar motors and the three Scott-Russell link mechanisms is used, but it is not limited by the four planar motors and a moving mechanism other than the planar motor can be also used as long as it is a moving mechanism moving on a plane, and, a driving mechanism of a variation below can be also used, for example.

<Variation>

Figure 3:
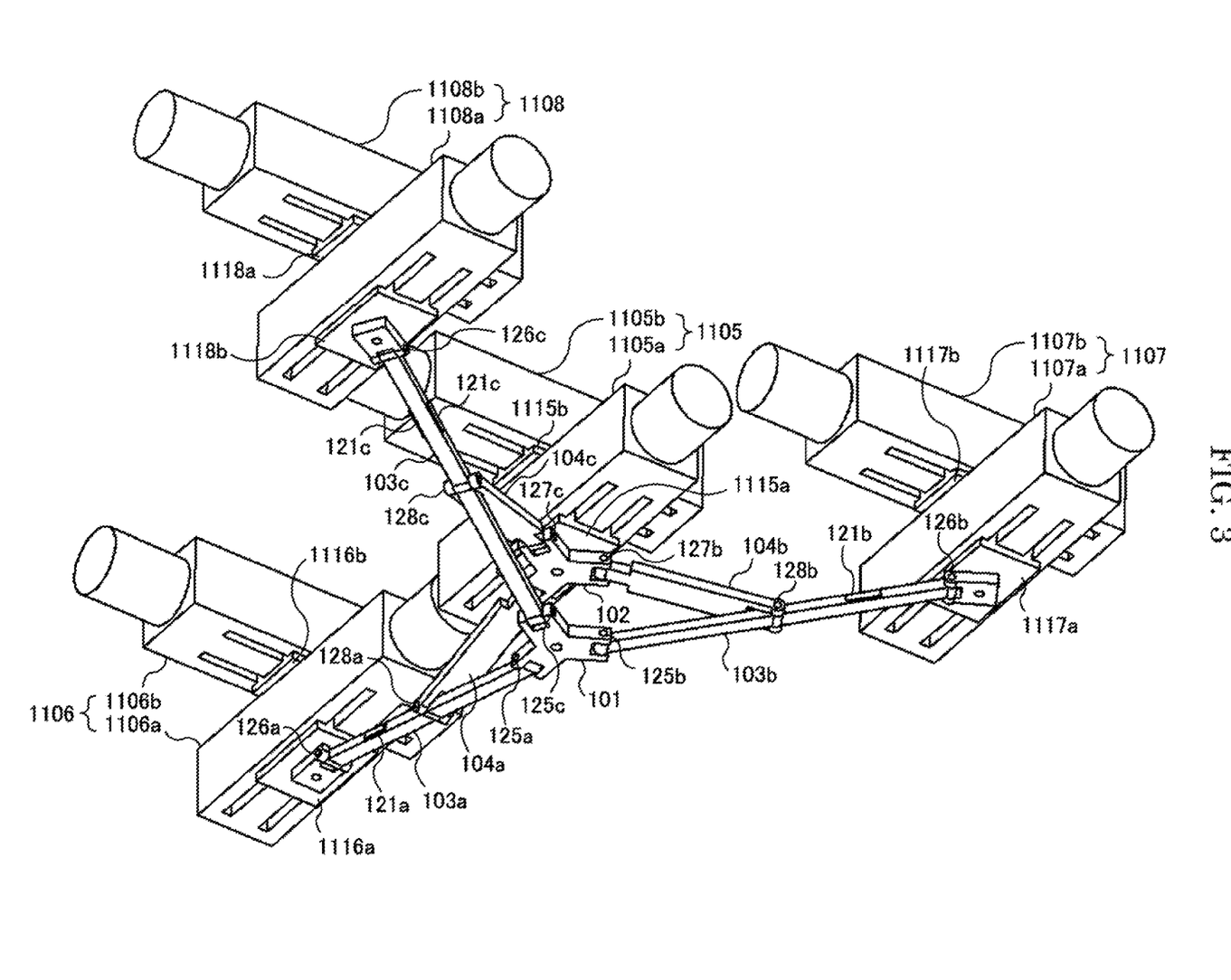
FIG. 3 is a schematic view illustrating a variation of the driving mechanism illustrated in FIG. 1.
Figure 4:
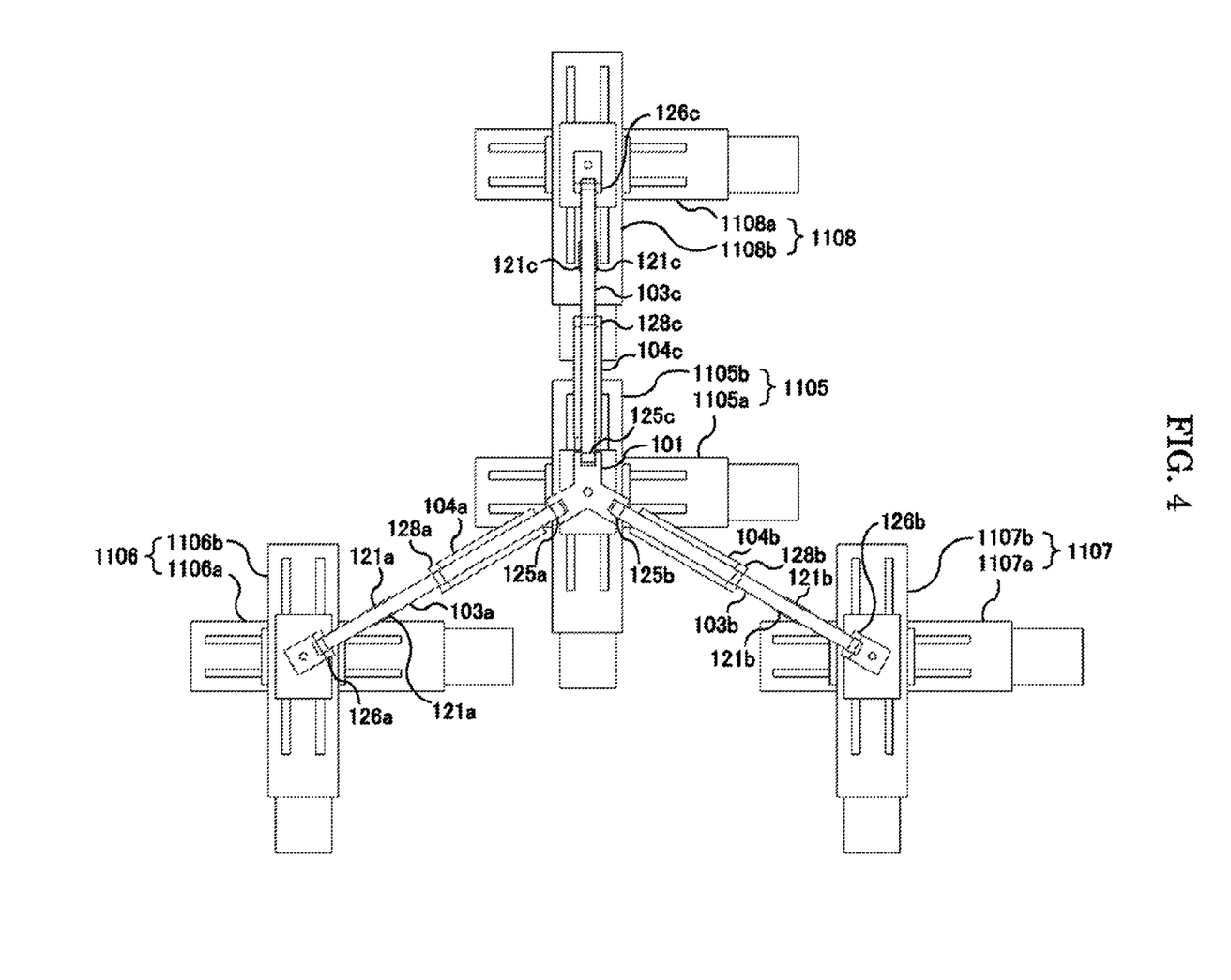
FIG. 4 is a plan view of the driving mechanism illustrated in FIG. 3.

FIG. 3 is a schematic view illustrating a variation of the driving mechanism illustrated in FIG. 1. FIG. 4 is a plan view of the driving mechanism illustrated in FIG. 3. In FIGS. 3 and 4, the same reference numerals are given to the same portions as those in FIGS. 1 and 2.

The driving mechanism of this variation can move the moving portion 101 in the space of the XYZ-axes by combining four XY tables and three Scott-Russell link mechanisms. For the four XY tables, known small-sized XY tables may be used.

In this variation, instead of the first planar motor 106 illustrated in FIGS. 1 and 2, a first XY table (hereinafter also referred to as an "8-o'clock table") 1106 illustrated in FIGS. 3 and 4 is used, instead of the second planar motor 107 illustrated In FIGS. 1 and 2, a second XY table (hereinafter also referred to as a "4-o'clock table") 1107 illustrated in FIGS. 3 and 4 is used, instead of the third planar motor 108 illustrated in FIGS. 1 and 2, a third XY table (hereinafter also referred to as a "12-o'clock table") 1108 illustrated in FIGS. 3 and 4 is used, and instead of the center planar motor 105 illustrated in FIGS. 1 and 2, a center XY table 1105 illustrated in FIGS. 3 and 4 used.

In detail, the 8-o'clock table 1106 has an 8-o'clock X-table 1106a and an 8-o'clock Y-table 1106b, the 8-o'clock X-table 1106a is mounted on an 8-o'clock Y-plate 1116b, and the 8-o'clock Y-plate 1116b is constituted movably in the Y-axis direction of the 8-o'clock Y-table 1106b, the second rotation fulcrum 126a is mounted on an 8-o'clock X-plate 1116a, and the 8-o'clock X-plate 1116a is constituted movably in the X-direction of the 8-o'clock X-table 1106a . As a result, the 8-o'clock X-plate 1116a is made movable on the same XY plane as the XY plane 200 illustrated in FIG. 1.

The 4-o'clock table 1107 has a 4-o'clock X-table 1107a and a 4-o'clock Y-table 1107b, the 4-o'clock X-table 1107a is mounted on a 4-o'clock Y-plate 1117b, and the 4-o'clock Y-plate 1117b is constituted movably in the Y-axis direction of the 4-o'clock Y-table 1107b, the sixth rotation fulcrum 126b is mounted on the 4-o'clock X-plate 1117a, and a 4-o'clock X-plate 1117a is constituted movably in the X-direction of the 4-o'clock X-table 1107a . As a result, the 4-o'clock X-plate 1117a is made movable on the same XY plane as the XY plane 200 illustrated FIG. 1.

The 12-o'clock table 1108 has a 12-o'clock X-table 1108a and a 12-o'clock Y-table 1108b, the 12-o'clock X-table 1108a is mounted on a 12-o'clock Y-plate 1118b, and the 12-o'clock Y-plate 1118b is constituted movably in the Y-axis direction of the 12-o'clock Y-table 1108*b*, the tenth rotation fulcrum 126*c* is mounted on the 12-o'clock X-plate 1118*a*, and the 12-o'clock X-plate 1118*a* is constituted movably in the X-direction of the 12-o'clock X-table 1108*a*. As a result, the 12-o'clock X-plate 1118*a* is made movable on the same XY plane as the XY plane 200 illustrated in FIG. 1.

The center XY table 1105 has a center X-table 1105*a* and a center Y-table 1105*b*, the center X-table 1105*a* mounted on a center Y-plate 1115*b*, and the center Y-plate 1115*b* is constituted movably in the Y-axis direction of the center Y-table 1105*b*, the fixed portion 102 on which the fourth rotation fulcrum 127*a*, the eighth rotation fulcrum 127*b*, and the twelfth rotation fulcrum 127*c* are mounted is mounted on the center X-plate 1115*a*, and the center X-plate 1115*a* is constituted movably in the X-direction of the center X-table 1105*a*. As a result, the center X-plate 1115*a* is made movable on the same XY plane as the XY plane 200 illustrated in FIG. 1.

As described above, each of the 8-o'clock X-plate 1116*a*, the 4-o'clock X-plate 1117*a*, the 12-o'clock X-plate 1118*a*, and the center X-plate 1115*a* is constituted to move on the same XY plane as the XY plane 200 illustrated in FIG. 1.

Since the driving mechanism of this variation has the constitution similar to that of the driving mechanism illustrated in FIGS. 1 and 2 other than the four XY tables 1105, 1106, 1107, and 1108 described above, explanation will be omitted.

In this variation, too, the effect similar to that of the first embodiment can be obtained.

(Second Embodiment)

Figure 5:
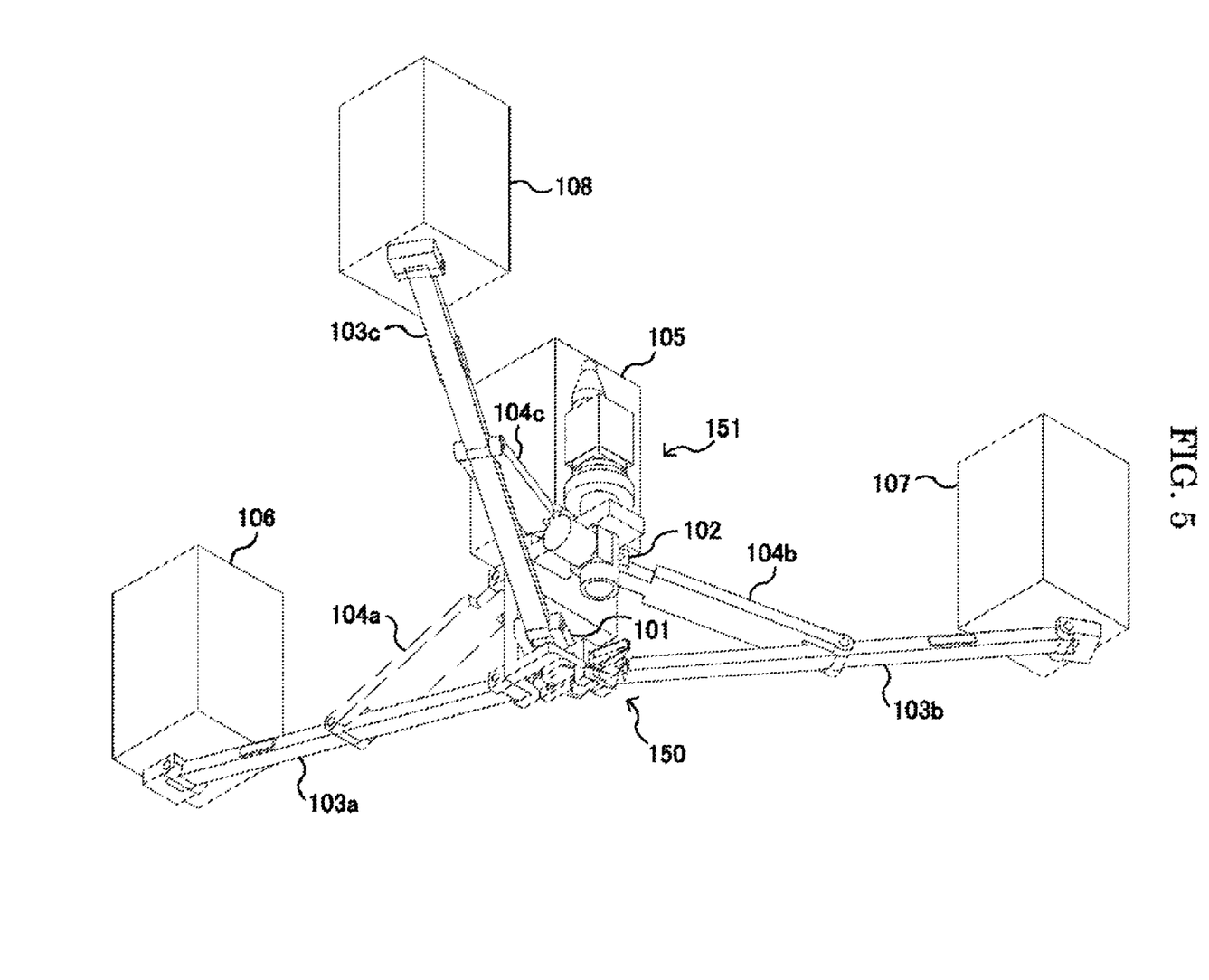
FIG. 5 is a perspective view schematically illustrating a bonding device according to an aspect of the present invention.

FIG. 5 is a perspective view schematically illustrating a bonding device according to an aspect of the present invention and the same reference numerals are given to the same portions as those in FIG. 1, and explanation for the same portions will be omitted.

The bonding device illustrated in FIG. 5 has a bonding mechanism required for a bonder such as a capillary, an ultrasonic horn, a clamp, a lens, and a spark rod mounted on the driving mechanism illustrated in FIG. 1.

In detail, an ultrasonic horn and a capillary 150 are mounted on the moving portion 101, a spark rod, a lens 151, and a metal wire supply system (not shown) are mounted on the fixed portion 102, and other components (not shown) required for the bonder are also mounted on the driving mechanism.

An operation of the bonding device will be explained.

A wire is supplied to the capillary 150, a ball is formed at a tip end of the wire fed out of the capillary, the ball is moved by the capillary to a 1st bonding point by the driving mechanism, and at that time, by applying a pressure to the ball from the capillary while applying ultrasonic vibration to the ball by the ultrasonic horn, the wire is bonded to the 1st bonding point and after that, the capillary is moved by the driving mechanism to a 2nd bonding point, and at that time, by applying a pressure from the capillary while applying ultrasonic vibration to the wire by the ultrasonic horn, the wire is bonded to the 2nd bonding point.

In this Description, the term "bonding mechanism" has a meaning including a mechanism for bonding a pad of a semiconductor chip and a lead frame by a wire and a mechanism for forming a bump on the pad of the semiconductor chip or a wiring board or the like, for example.

In this embodiment, too, the effect similar to that of the first embodiment can be obtained.

Moreover, according to this embodiment, since the bonding mechanism such as a capillary is mounted on the driving mechanism illustrated in FIG. 1, a load can be made smaller and a driving mechanism advantageous for higher acceleration/deceleration can be realized as compared with the driving mechanism of the prior-art wire bonding device illustrated in FIG. 10.

Moreover, even if the moving portion 101 is moved in the XYZ-directions by the driving mechanism, the moving portion 101 is moved only in the Z-axis direction relatively to the fixed portion 102. Thus, a Z-linear encoder (not shown) for position detection in the Z-axis direction is desirably arranged between the moving portion 101 and the fixed portion 102 (on the fixed portion 102, for example). By detecting the position of the capillary by this Z-linear encoder and by feeding it back to the control portion, a bonding work can be performed accurately.

(Third Embodiment)

Figure 6:
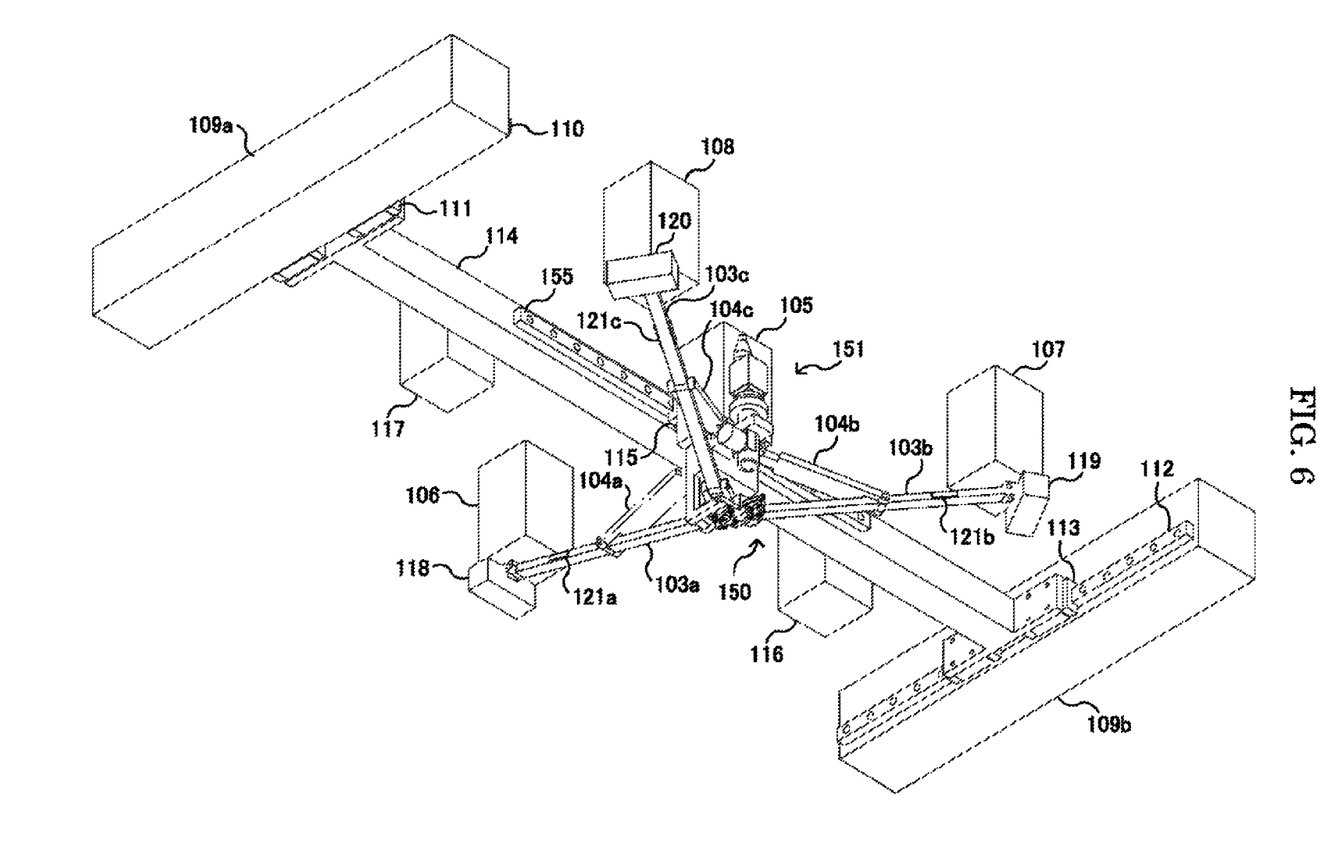
FIG. 6 is a perspective view schematically illustrating the bonding device according to the aspect of the present invention.
Figure 7:
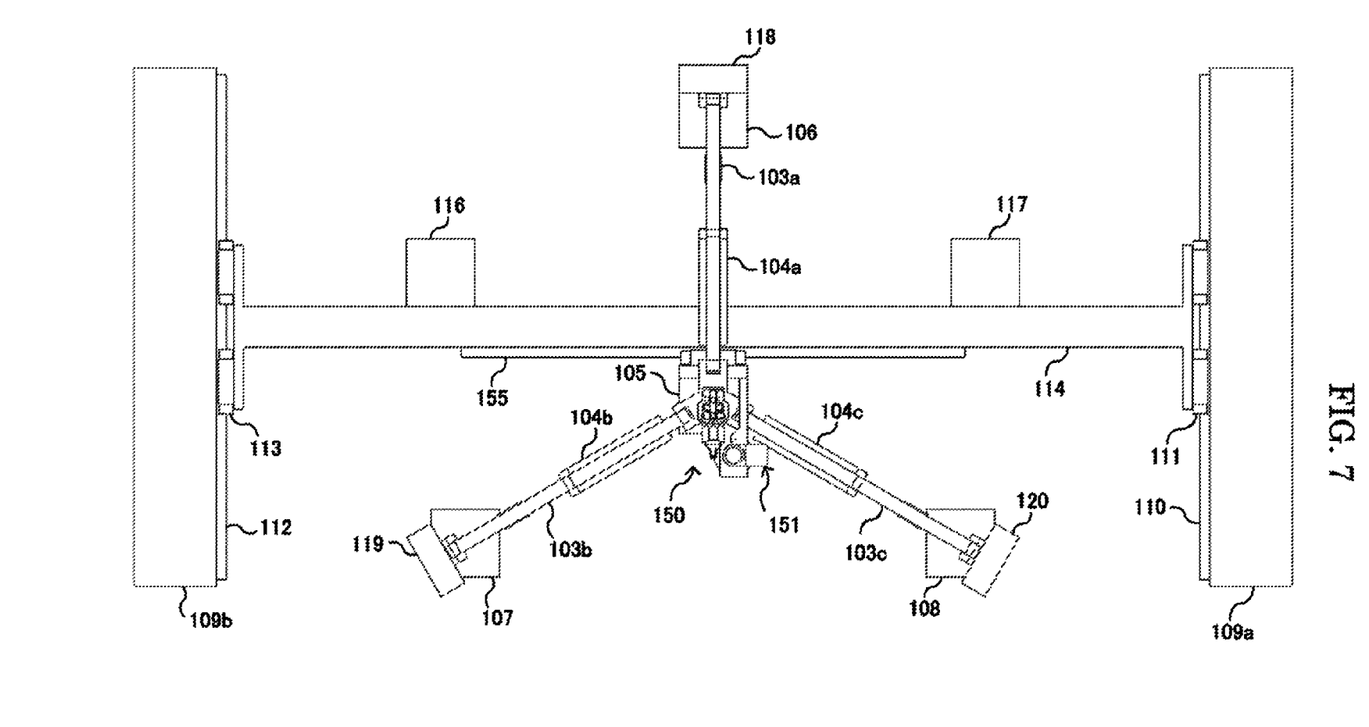
FIG. 7 is a plan view of the bonding device illustrated in FIG. 6.

FIG. 6 is a perspective view schematically illustrating a bonding device according to an aspect of the present invention. FIG. 7 is a plan view of the bonding device illustrated in FIG. 6. In FIGS. 6 and 7, the same reference numerals are given to the same portions as those in FIG. 5, and explanation for the same portions will be omitted.

The bonding device illustrated in FIGS. 6 and 7 has a first linear guide 155 and a third moving mechanism for moving the first linear guide 155 and the like mounted on the bonding device illustrated in FIG. 5.

In detail, the bonding device has an X-restricting block 114 provided with the first linear guide 155 which guides the center planar motor 105 so as to move on a first straight line on a plane on which the center planar motor 105 moves or along the first straight line and a third moving mechanism for moving the first linear guide 155 on a second straight line on the plane crossing the first straight line or along the second straight line. The first straight line is located in parallel with the first linear guide 155, and the second straight line crosses the first straight line at a right angle.

The third moving mechanism is a mechanism for moving the X-restricting block 114 and has a fixed base 109*a* and a fixed base 109*b* provided with a Y-exclusive L-fixed linear guide 110 and a Y-exclusive R-fixed linear guide 112 for guiding both ends of the X-restricting block 114 so as to move on the second straight line or along the second straight line and has a Y-exclusive R-linear motor 116 and a Y-exclusive L-linear motor 117 for moving the X-restricting block 114 on the second straight line or along the second straight line.

The X-restricting block 114 is constituted to be able to move only the Y-axis direction by the Y-exclusive L-fixed linear guide 110 and the Y-exclusive R-fixed linear guide 112 fixed to the fixed bases 109*a* and 109*b*. Moreover, the center planar motor 105 is constituted to be able to move in the X-axis direction by the first linear guide 155 fixed to the X-restricting block 114.

The Y-exclusive R-linear motor 116 and the Y-exclusive; L-linear motor 117 are driving sources for moving the X-restricting block 114 in the Y-axis direction in order to handle weights of the X-restricting block 114, the moving portion 101, the fixed portion, the bonding mechanism and the like. Moreover, since an increase in a load caused by an increase in the mass of the x-restricting block 114 can be compensated for by driving forces of the Y-exclusive R-linear motor 116 and the Y-exclusive L-linear motor 117, a driving mechanism advantageous for high acceleration/deceleration can be realized.

On one end of the X-restricting block 114, a Y-exclusive L-encoder 111 is installed, while on the other end of the X-restricting block 114, a Y-exclusive R-encoder 113 is installed. The Y-exclusive L-linear motor 117 is controlled by the Y-exclusive L-encoder 111, and the Y-exclusive R-linear motor 116 is controlled by the Y-exclusive R-encoder 113. As a result, rigidity in a Zθ (rotation around the Z-axis) direction by a servo can be increased in addition to mechanical rigidity. That is, by synchronously controlling the Y-exclusive L-linear motor 117 and the Y-exclusive R-linear motor 116, rotation around the Z-axis can be suppressed.

On the first linear guide 155 of the X-restricting block 114, an X-exclusive encoder 115 is installed. Movement of the center planar motor 105 in the X-axis direction is controlled by the X-exclusive encoder 115.

The 8-o'clock motor 106, the 4-o'clock motor 107, and the 12-o'clock motor 108 which are the driving sources of the driving mechanism need to be accurately synchronized and should be controlled at appropriate positions at all times.

Thus, a first angular encoder 118 is installed below the 8-o'clock motor 106, a second angular encoder 119 is installed below the 4-o'clock motor 107, and a third angular encoder 120 is installed below the 12-o'clock motor 108. As a result, an angle of each of the first rod 103a, the second rod 104a, and the third rod 103b is detected and fed back to the control portion. On the basis of the angle detected by each of the first to third angular encoders 118, 119, and 120, control is executed by the control portion so as to correct a positional shift of each of the 8-o'clock motor 106, the 4-o'clock motor 107, and the 12-o'clock motor 108.

Moreover, a first strain gauge 121a which is a stress detection sensor is installed on both side surfaces of the first rod 103a, a second strain gauge 121b which is a stress detection sensor is installed on both side surfaces of the third rod 103b, and a third strain gauge 121c which is a stress detection sensor is installed on both side surfaces of the fifth rod 103c. If an appropriate positional relationship among the 8-o'clock motor 106, the 4-o'clock motor 107, and the 12-o'clock motor 108 is lost, uneven stress is applied to the both side surfaces of the first to sixth rods, and the strain is detected by the first to third strain gauges 121a, 121b, and 121c and is fed back to the control portion. Then, on the basis of the detected strain, control is executed by the control portion so as to correct a positional shift of each of the 8-o'clock motor 106, the 4-o'clock motor 107, and the 12-o'clock motor 108. At that time, control may be executed so that a difference in the strain between the both side surfaces becomes zero.

In this embodiment, the first to third strain gauges 121a, 121b, and 121c are Installed on the both side surfaces of the first rod 103a, the third rod 103b, and the fifth rod 103c, but the first to third strain gauges 121a, 121b, and, 121c may be installed on the both side surfaces of the second rod 104a, the fourth rod 104b, and the sixth rod 104c and the strains of these rods may be detected.

In this embodiment, too, the effect similar to that of the second embodiment can be obtained.

(Fourth Embodiment)

Figure 8:
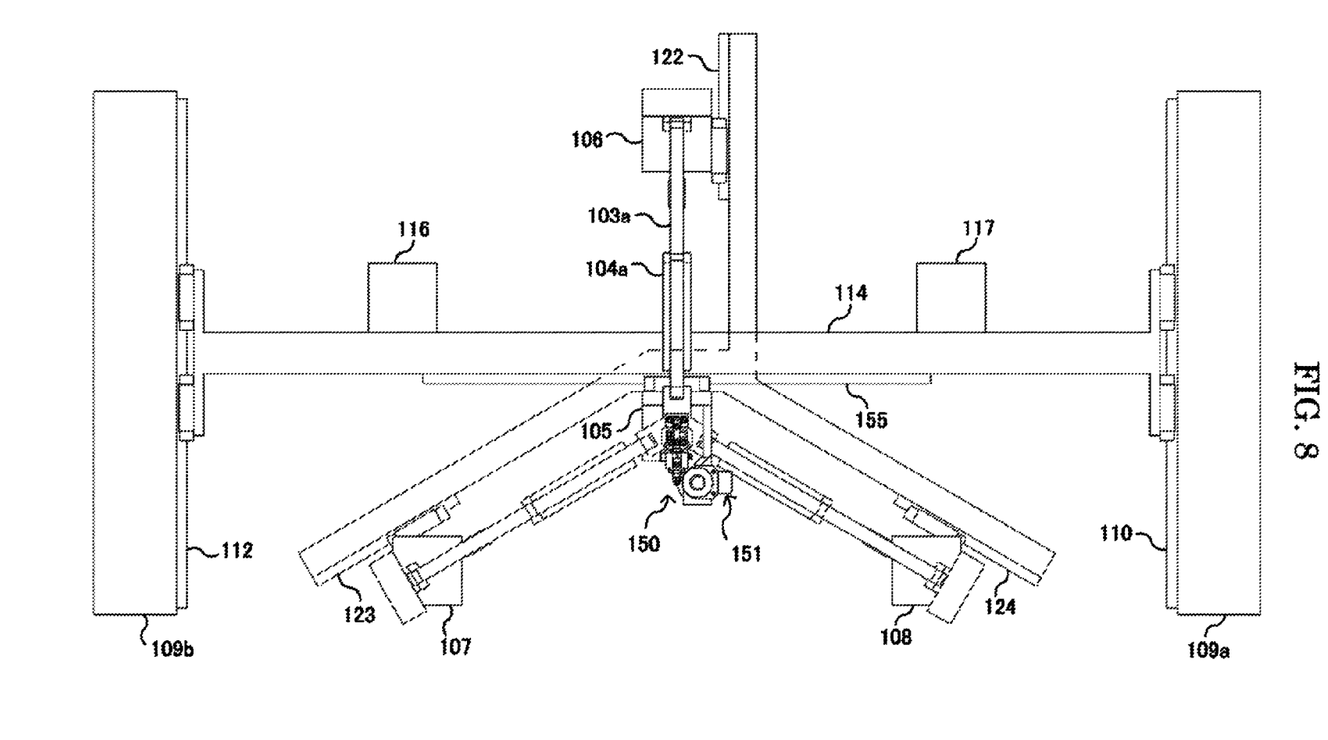
FIG. 8 is a plan view schematically illustrating the bonding device according to the aspect of the present invention.

FIG. 8 is a plan view schematically illustrating a bonding device according to one aspect of the present invention, and the same reference numerals are given to the same portions as those in FIGS. 6 and 7, and explanation for the same portions will be omitted.

The bonding device illustrated in FIG. 8 has second to fourth linear guides 122, 123, and 124 mounted on the bonding device illustrated in FIGS. 6 and 7.

In detail, on the X-restricting block 114, the second linear guide 122 which guides the 8-o'clock motor 106 to move on a third straight line connecting the center planar motor 105 and the 8-o'clock motor 106 is installed, the third linear guide 123 which guides the 4-o'clock motor 107 to move on a fourth straight line connecting the center planar motor 105 and the 4-o'clock motor 107 is installed, and the fourth linear guide 124 which, guides the 12-o'clock motor 108 to move on a fifth straight line connecting the center planar motor 105 and the 12-o'clock motor 108 is installed. Each of the third straight line, the fourth straight line, and the fifth straight line is located on the plane on which the center planar motor 105 is moved.

Each of the second to fourth linear guides 122, 123, and 124 is guided so as to move on the first straight line or along the first straight line by the first linear guide 155. That is each of the second to fourth linear guides 122, 123, and 124 is connected to the center planar motor 105 (or the fixed portion 102) and is constituted so as to move both in the X-direction and the Y-direction together with the center planar motor 105. By means of the first to fourth linear guides 155, 122, 123, and 124, the first planar motor 106 can hold the position of 8 o'clock, the second planar motor 107 can hold the position of 4 o'clock, and the, third planar motor 108 can hold the position of 12 o'clock reliably with the center planar motor 105 as the center.

In this embodiment, too, the effect similar to that of the third embodiment can be obtained.

(Fifth Embodiment)

A manufacturing device according to one aspect of the present invention has the driving mechanism described in any of the first to fourth embodiments mounted on a manufacturing device other than the bonding device.

In this embodiment, too, the effect similar to those of the first to fourth embodiments can be obtained.

The first to fifth embodiments described above may be put into practice in combination with each other.

EXPLANATION OF SYMBOLS

90 straight line
101 moving portion
102 fixed portion
103a first rod
103b third rod
103c fifth rod
104a second rod
104b fourth rod
104c sixth rod
105 center planar motor
106 first planar motor (8-o'clock motor)
107 second planar motor (4-o'clock motor)
108 third planar motor (12-o'clock motor)
109a, 109b fixed bases
110 Y-exclusive L-fixed linear guide
111 Y-exclusive L-encoder
112 Y-exclusive R-fixed linear guide
113 Y-exclusive R-encoder
114 X-restricting block
115 X-exclusive encoder
116 Y-exclusive R-linear motor
117 Y-exclusive L-linear motor
118 first angular encoder
119 second angular encoder
120 third angular encoder
121a first strain gauge
121b second strain gauge
121c third strain gauge
122 second linear guide
123 third linear guide 124 fourth linear guide
125a first rotation fulcrum
125b fifth rotation fulcrum
125c ninth rotation fulcrum
126a second rotation fulcrum
126b sixth rotation fulcrum
126c tenth rotation fulcrum
127a fourth rotation fulcrum
127b eighth rotation fulcrum
127c twelfth rotation fulcrum
128a third rotation fulcrum
128b seventh rotation fulcrum
128c eleventh rotation fulcrum
150 ultrasonic horn and capillary
151 spark rod and lens
155 first linear guide
200 XY plane
1105 center XI table
1105a center X-table
1105b center Y-table
1106 first XY table (8-o'clock table)
1106a 8-o'clock X-table
1106b 8-o'clock Y-table
1107 second XY table (4-o'clock table)
1107a 4-o'clock X-table
1107b 4-o'clock Y-table
1108 third XY table (12-o'clock table)
1108a 12-o'clock X-table
1108b 12-o'clock Y-table
1115a center X-plate
1115b center Y-plate
1116a 8-o'clock X-plate
1116b 8-o'clock Y-plate
1117a 4-o'clock X-plate
1117b 4-o'clock Y-plate
1118a 12-o'clock X-plate
1118b 12-o'clock Y-plate

The invention claimed is:

1. A driving mechanism comprising a first rod, a second rod, a first moving mechanism moving on a plane, a center moving mechanism moving on said plane, and a moving portion, wherein:
   one end of said first rod is rotatably connected to said moving portion by a first rotation fulcrum;
   the other end of said first rod is rotatably connected to said first moving mechanism by a second rotation fulcrum;
   one end of said second rod is rotatably connected by a third rotation fulcrum provided on said first rod;
   the other end of said second rod is rotatably connected to said center moving mechanism by a fourth rotation fulcrum;
   said moving portion is moved so as to recede from said center moving mechanism when said first moving mechanism is moved near to said center moving mechanism; and
   said moving portion is moved so as to approach said center moving mechanism when said first moving mechanism is moved away from said center moving mechanism;
   said first moving mechanism is a first planar motor that moves in XY directions or a first XY table that moves in the XY directions; and
   said center moving mechanism is a center planar motor that moves in the XY directions or a center XY table that moves in the XY directions.

2. The driving mechanism according to claim 1, further comprising a third rod, a fourth rod and a second moving mechanism moving on said plane, wherein:
   one end of said third rod is rotatably connected to said moving portion by a fifth rotation fulcrum;
   the other end of said third rod is rotatably connected to said second moving mechanism by a sixth rotation fulcrum;
   one end of said fourth rod is rotatably connected by a seventh rotation fulcrum provided on said third rod;
   the other end of said fourth rod is rotatably connected to said center moving mechanism by an eighth rotation fulcrum;
   said moving portion is moved so as to recede from said center moving mechanism when said second moving mechanism is moved near to said center moving mechanism; and
   said moving portion is moved so as to approach said center moving mechanism when said second moving mechanism is moved away from said center moving mechanism.

3. The driving mechanism according to claim 1, further comprising:
   a first linear guide which guides said center moving mechanism so as to move on a first straight line on said plane; and
   a third moving mechanism which moves said first linear guide along a second straight line on said plane crossing said first straight line.

4. The driving mechanism according to claim 3, wherein said third moving mechanism includes:
   a fixed linear guide which guides both ends of said first linear guide so as to move on said second straight line; and
   a linear motor which moves said first linear guide on said second straight line.

5. The driving mechanism according to claim 3, further comprising a second linear guide which guides said first moving mechanism so as to move on a third straight line on said plane connecting said center moving mechanism and said first moving mechanism, wherein
   said second linear guide is guided by said first linear guide so as to move along said first straight line.

6. The driving mechanism according to claim 1, further comprising:
   an angular encoder which detects an angle of said first rod or said second rod; and
   a control portion which controls said first planar motor so as to correct a positional shift of said first moving mechanism on the basis of said angle detected by said angular encoder.

7. The driving mechanism according to claim 1, further comprising:
   a stress detection sensor which detects strain of said first rod or said second rod; and
   a control portion which controls said first moving mechanism so as to correct a positional shift of said first moving mechanism on the basis of said strain detected by said stress detection sensor.

8. A manufacturing device comprising a driving mechanism according to claim 1.

9. The manufacturing device according to claim 8, further comprising:
- a capillary arranged on said moving portion; and
- a bonding mechanism which supplies a wire to said capillary and performs wire bonding.

* * * * *